US011218123B2

(12) United States Patent
Jordanger et al.

(10) Patent No.: US 11,218,123 B2
(45) Date of Patent: Jan. 4, 2022

(54) CHOPPER STABILIZED ATTENUATION FOR SENSE AMPLIFIERS

(71) Applicant: Texas Instruments Incorporated, Dallas, TX (US)

(72) Inventors: Ricky Dale Jordanger, Allen, TX (US); Hector Torres, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/817,084

(22) Filed: Mar. 12, 2020

(65) Prior Publication Data

US 2021/0288621 A1   Sep. 16, 2021

(51) Int. Cl.
  *H03F 1/02* (2006.01)
  *H03F 3/387* (2006.01)
  *H03F 3/45* (2006.01)
  *H03G 1/00* (2006.01)

(52) U.S. Cl.
  CPC ......... *H03F 3/387* (2013.01); *H03F 3/45071* (2013.01); *H03F 2200/211* (2013.01); *H03F 2200/261* (2013.01); *H03G 1/0088* (2013.01)

(58) Field of Classification Search
  CPC ............... H03F 3/387; H03F 3/45071; H03F 2200/211; H03F 2200/261; H03F 3/45475; H03F 1/303; H03G 1/0088; H03G 3/001; H03G 3/3036
  USPC ............................................. 330/9, 144, 284
  See application file for complete search history.

(56) References Cited

U.S. PATENT DOCUMENTS

| 6,617,838 | B1  | 9/2003  | Miranda et al. |
| 7,724,080 | B2* | 5/2010  | Luff .................... H03F 3/45475 330/9 |
| 8,604,762 | B2* | 12/2013 | Bakkaloglu ............... H03F 1/26 323/280 |
| 9,793,707 | B2  | 10/2017 | Torres et al. |
| 10,840,863 | B2* | 11/2020 | Kasha ....................... H03F 1/26 |
| 2016/0112037 | A1 | 4/2016 | Lyden et al. |
| 2017/0047896 | A1 | 2/2017 | Shu et al. |
| 2020/0007102 | A1 | 1/2020 | Lee et al. |

OTHER PUBLICATIONS

PCT Search Report and Written Opinion dated Jun. 17, 2021.

* cited by examiner

*Primary Examiner* — Khanh V Nguyen
(74) *Attorney, Agent, or Firm* — Valerie M. Davis; Charles A. Brill; Frank D. Cimino

(57) ABSTRACT

A current sense loop includes an attenuator circuit, which has an embedded input chopper circuit, and an amplifier circuit, which has an output chopper circuit. The embedded input chopper has a first chopper input that is coupled to a first attenuator input, a first chopper output that is coupled to a first attenuator output, a second chopper input that is coupled to a second attenuator input, and a second chopper output that is coupled to a second attenuator output. An amplifier has a first input coupled to the first attenuator output and a second input coupled to the second attenuator output. An NFET has a gate coupled to the amplifier output, a source coupled to a ground plane, and a drain coupled to the second attenuator input.

21 Claims, 5 Drawing Sheets

CHOPPER STABILIZED ATTENUATION FOR SENSE AMPLIFIERS

BACKGROUND

When an amplifier in a current sense loop requires higher precision, a chopper amplifier, i.e., an amplifier with a modulator at the input and a demodulator at the output, is a common solution to significantly reduce the random input offset. The chopper amplifier is generally constructed using low-voltage components because the low voltage components provide superior matching and require less area. When such a current sense loop is placed in a high-voltage circuit, an attenuator can be incorporated to lower the common-mode signal, although the attenuator may introduce additional error due to the difficulty in matching components.

SUMMARY

Disclosed embodiments disclose a current sense loop for use in high-voltage applications. The current sense loop has both an attenuator and a chopper amplifier; in order to reduce offset caused by the mismatch of resistors in the attenuator, the input chopper is embedded in the attenuator, so that part of the resistor mismatch is removed by the chopping action. Using the disclosed circuit, a 0.01% ΔV error was achieved for the resistors in the attenuator.

In one aspect, an embodiment of a current sense loop is disclosed. The current sense loop includes an attenuator circuit that includes a first leg, a second leg, and an embedded input chopper circuit, the first leg having a first attenuator input and a first attenuator output, the second leg having a second attenuator input and a second attenuator output, the embedded input chopper circuit having a first chopper input, a first chopper output, a second chopper input, and a second chopper output, the first chopper input coupled to the first attenuator input, the first chopper output coupled to the first attenuator output, the second chopper input coupled to the second attenuator input, and the second chopper output coupled to the second attenuator output; an amplifier circuit having a first amplifier input, a second amplifier input, and an amplifier output, the first amplifier input being coupled to the first attenuator output, the second amplifier input being coupled to the second attenuator output, the amplifier circuit further including an output chopper circuit; and an N-type field effect transistor (NFET) having a gate coupled to the amplifier output, a source coupled to a ground plane, and a drain coupled to the second attenuator input.

In another aspect, an embodiment of an electronic device is disclosed. The electronic device includes a power switch having a first power terminal and a second power terminal, the first power terminal coupled to a power input pin and the second power terminal coupled to a power output pin; a sense switch having a first sense terminal and a second sense terminal, the first sense terminal coupled to a sensed voltage; an attenuator circuit having a first attenuator input, a first attenuator output, a second attenuator input, a second attenuator output, and an input chopper circuit embedded therein, the first attenuator input coupled to the second power terminal, the second attenuator input coupled to the second sense terminal, the embedded input chopper circuit having a first chopper input, a first chopper output, a second chopper input, and a second chopper output, the first chopper input coupled to the first attenuator input, the first chopper output coupled to the first attenuator output, the second chopper input coupled to the second attenuator input, and the second chopper output coupled to the second attenuator output; an amplifier circuit having a first amplifier input, a second amplifier input, an amplifier output, and an output chopper circuit, the first amplifier input coupled to the first attenuator output, the second amplifier input coupled to the second attenuator output; and an N-type field effect transistor (NFET) having a gate coupled to the amplifier output, a source coupled to a ground plane, and a drain coupled to the second attenuator input.

In yet another aspect, an embodiment of a method of operating an electronic device that includes a current sense loop is disclosed. The method includes receiving a first voltage from a power field effect transistor (FET) at a first attenuator input; receiving a second voltage from a sense FET at a second attenuator input; dropping the first voltage into a low-voltage range to create a third voltage; dropping the second voltage into the low-voltage range to create a fourth voltage; modulating the third voltage and the fourth voltage at an input chopper to create a first chopped voltage and a second chopped voltage; providing the first chopped voltage to a first resistor ladder and sending a third chopped voltage from an internal node in the first resistor ladder to a first amplifier input of an amplifier circuit; providing the second chopped voltage to a second resistor ladder and sending a fourth chopped voltage from an internal node in the second resistor ladder to a second amplifier input of the amplifier circuit; subsequent to amplifying the third chopped voltage and the fourth chopped voltage to create an amplified third chopped voltage and an amplified fourth chopped voltage, demodulating the amplified third chopped voltage and the amplified fourth chopped voltage to create a fifth voltage and a sixth voltage; and providing a difference between the fifth voltage and the sixth voltage to a gate of an N-type field effect transistor (NFET), a source of the NFET being coupled to a ground plane and a drain of the NFET being coupled to the second attenuator input.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The following discussion refers to both high-voltage and low-voltage circuits. For the purpose of the present application, a low-voltage circuit uses a voltage that is less than or equal to about 7 V, while a high-voltage circuit uses a voltage that is greater than about 7 V.

Figure 4:
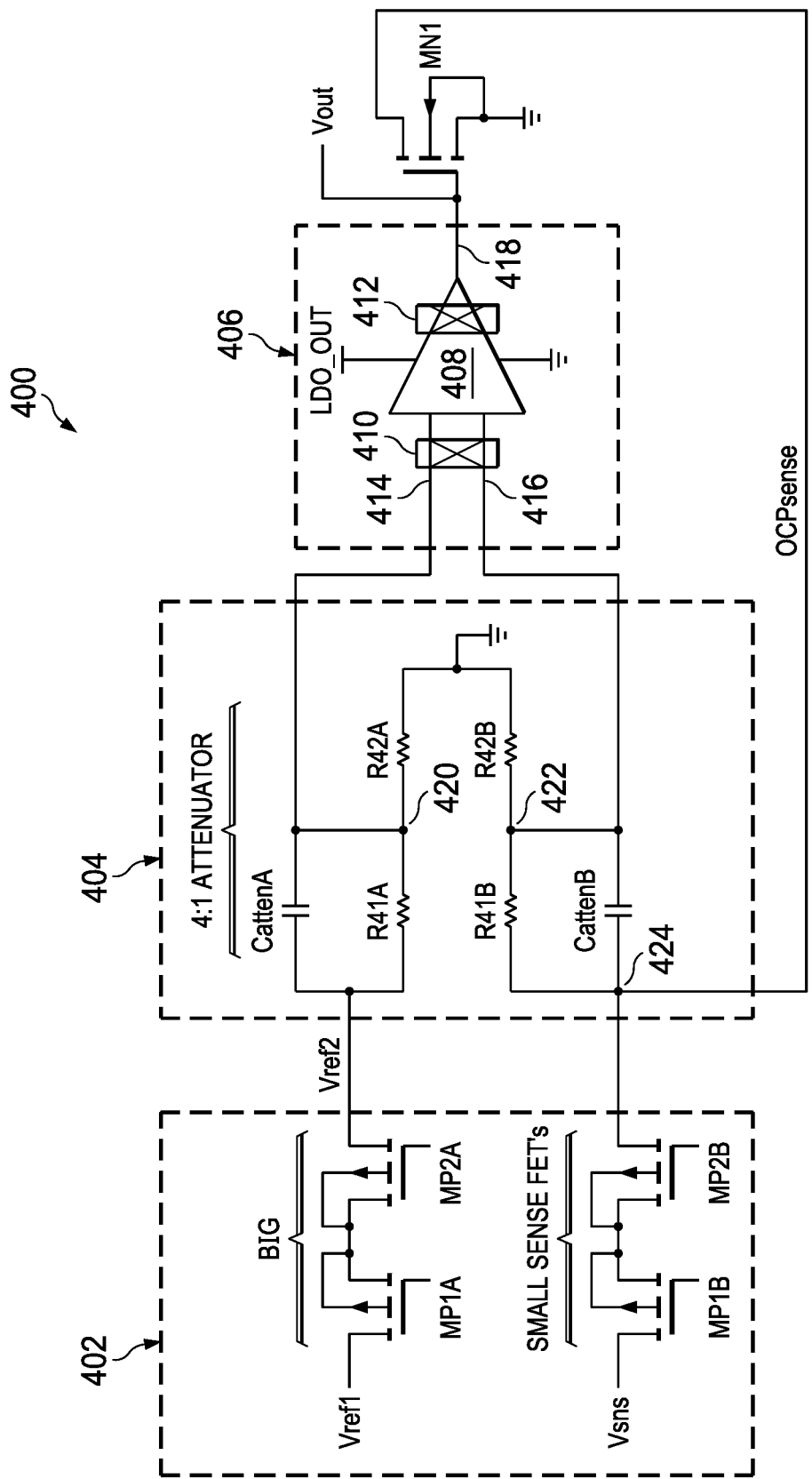
FIG. 4 depicts a current sense loop with a chopper amplifier according to a prior design.

FIG. 4 depicts a conventional current sense loop 400 for a high-voltage application. Current sense loop 400 includes switches 402, attenuator 404, chopper amplifier 406 and an N-type field effect transistor (NFET) MN1. Chopper amplifier 406, which will be discussed in greater detail below, includes an operational transconductance amplifier 408, an input chopper 410, and an output chopper 412. Chopper amplifier 406 has a first input 414, a second input 416, and an output 418 that is coupled to the gate of NFET MN1. The source of NFET MN1 is coupled to a ground plane.

Within switches 402, a first power P-type field effect transistor (PFET) MP1A is coupled in series with a second power PFET MP2A and a first sense PFET MP1B is coupled in series with a second sense PFET MP2B. First power PFET MP1A receives a first reference voltage Vref and second power PFET MP2A provides a second reference voltage Vref2; first sense PFET MP1B receives a sensed voltage Vsns and second sense PFET MP2B provides an overcurrent protection voltage OCPsense. Each of first power PFET MP1A, second power PFET MP2A, first sense PFET MP1B, and second sense PFET MP2B are coupled to be controlled by a single driver circuit. The output Vo of current sense loop 400.

The first input 414 of chopper amplifier 406 is coupled to receive a voltage that is switched through a first power P-type field effect transistor (PFET) MP1A and a second power PFET MP2A and attenuated by a first leg of attenuator 404. The first leg of attenuator 404 includes high-voltage resistor R41A coupled in series with high-voltage resistor R42A between the output of second power PFET MP2A and the ground plane and further includes first attenuation capacitor CattenA, which has a first terminal coupled to the output of second power PFET MP2A and a second terminal coupled to a node 420 that lies between high-voltage resistor R41A and high-voltage resistor R42A. The second terminal of first attenuation capacitor CattenA is also coupled to the first input 414 of chopper amplifier 406.

The second input 416 of chopper amplifier 406 is coupled to receive a voltage that is switched through a first sense PFET MP1B and a second sense PFET MP2B and attenuated by a second leg of attenuator 404. The second leg of attenuator 404 includes high-voltage resistor R41B coupled in series with high-voltage resistor R42B between the output of second sense PFET MP2B and the ground plane and further includes second attenuation capacitor CattenB, which has a first terminal coupled to the output of second sense PFET MP2B and a second terminal coupled to a node 422 that lies between high-voltage resistor R41B and high-voltage resistor R42B. The second terminal of second attenuation capacitor CattenB is also coupled to the second input 416 of chopper amplifier 406. The drain of NFET MN1 is coupled to a node 424 between second sense PFET MP2B and the first terminal of second attenuation capacitor CattenB.

Figure 5:
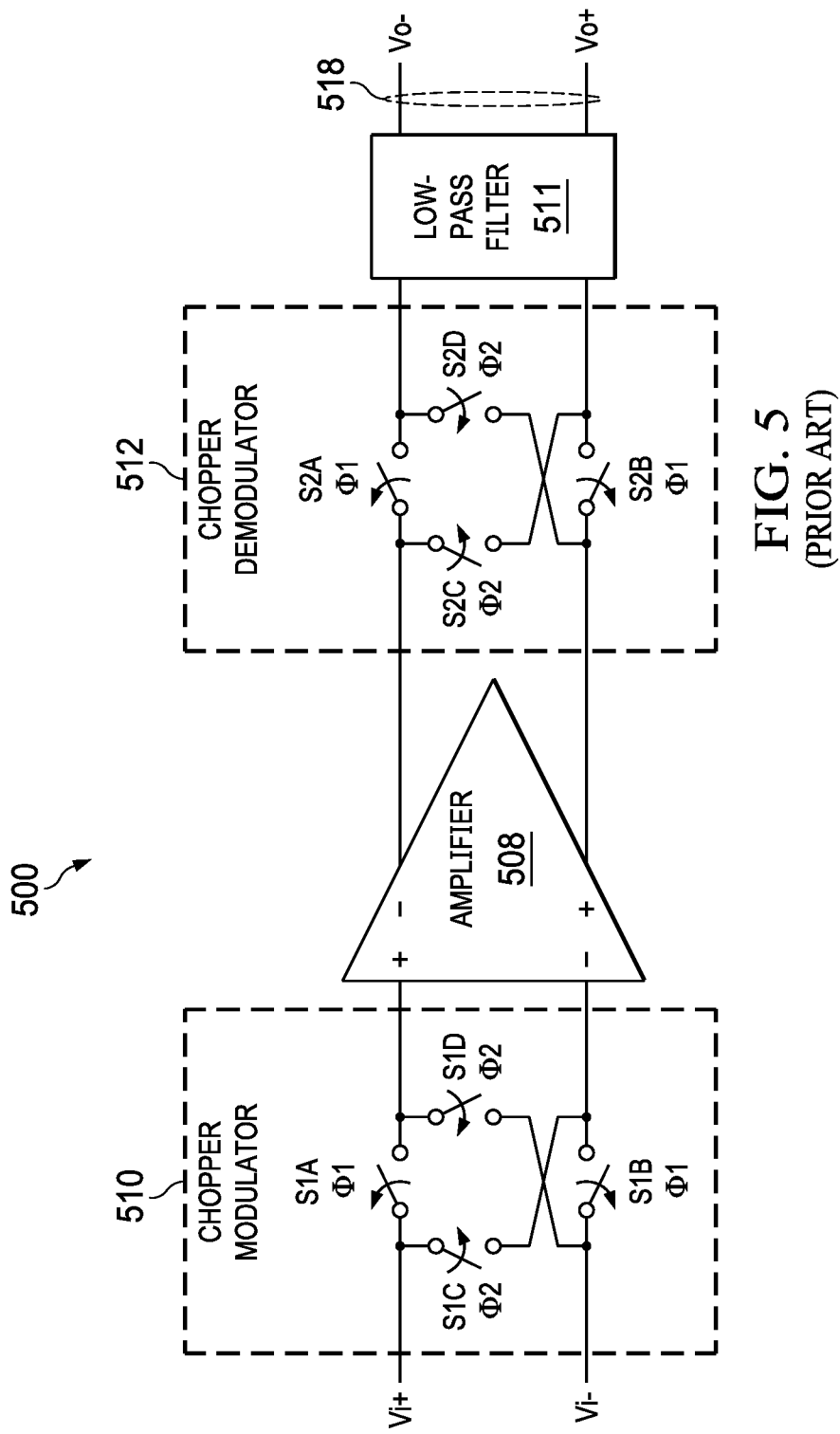
FIG. 5 depicts a conventional differential chopper amplifier.

FIG. 5 depicts a chopper amplifier 500 in greater detail in order to clarify the action of the added chopper. Chopper amplifier 500 generally corresponds to chopper amplifier 406, although chopper amplifier 500 has a differential output 518 rather than the single output 418 of chopper amplifier 400. Chopper amplifier 500 includes an amplifier 508, an input chopper circuit 510, an output chopper circuit 512, and a low-pass filter 511. Input chopper circuit 510 and output chopper circuit 512 are also referred to as a chopper modulator and a chopper demodulator respectively. Amplifier 508 has a non-inverting input, an inverting input, an inverting output, and a non-inverting output; low-pass filter 511 has a first input, a second input, a first output Vo−, and a second output Vo+, where the first output Vo− and the second output Vo+ together form differential output 518.

Input chopper circuit 510 includes a first switch S1A that couples the first input signal Vi+ to the non-inverting input of amplifier 508, a second switch S1B that couples the second input signal Vi− to the inverting input of amplifier 508, a third switch S1C that couples the first input signal Vi+ to the inverting input of amplifier 508, and a fourth switch S1D that couples the second input signal Vi− to the non-inverting input of amplifier 508.

Similarly, output chopper circuit 512 includes a fifth switch S2A that couples the inverting output of amplifier 508 to the first input of low-pass filter 511, a sixth switch S2B that couples the non-inverting output of amplifier 508 to the second input of low-pass filter 511, a seventh switch S2C that couples the inverting output of amplifier 508 to the second input of low-pass filter 511, and an eighth switch S2D that couples the non-inverting output of amplifier 508 to the first input of low-pass filter 511. Each of first switch S1A, second switch S1B, fifth switch S2A, and sixth switch S2B are closed during a first phase φ1 and open during a second phase φ2. Each of third switch S1C, fourth switch S1D, seventh switch S2C, and eighth switch S2D are open during the first phase φ1 and closed during the second phase φ2.

In chopping the input signals, the input chopper circuit 510 switches the input signals Vi+ and Vi− between the first input of amplifier 508 and the second input of amplifier 508 so that offset in the signals is shared equally between the inputs, as long as the duty cycle of the chopper modulator is about fifty percent. Once the two signals are amplified by amplifier 508, the amplified signals are demodulated by the output chopper circuit 512, which is synchronized with input chopper circuit 510. The signals then go through low-pass filter 511 and provide the final output signals Vo− and Vo+. When a chopper amplifier has a single output, such as the output 418 of chopper amplifier 406, the output signal Vo is the difference between the two amplified signals.

Returning to current sense loop 400, because the first sense PFET MP1B and the second sense PFET MP2B are designed to pass the same voltage as first power PFET MP1A and second power PFET MP2A, second reference voltage Vref2 and overcurrent protection voltage OCPsense are generally equal; any error in current sense loop 400 is equal to the differential voltage error at the input of attenuator 404, i.e., Error=Vref2−OCPsense One issue that can cause error in the current sense loop 400 is the matching of the resistors in attenuator 404 and the size of resistors that are needed to achieve a level of precision in a given specification. In one embodiment of current sense loop 400, the input voltage into current sense loop 400 was 14 V. Using attenuation resistors that were sized at 4,377, 315 μm², the 3-sigma error contribution of the attenuation resistors was 0.0173 percent, which did not meet a desired value of 0.01 percent. Although increasing the size of the attenuation resistors could be used to decrease the mismatch error, a determination was made that the increase in size of the resistors needed to meet the desired error level was quite expensive in terms of real estate on a chip containing the current sense loop 400. A smarter approach was needed.

Figure 1:
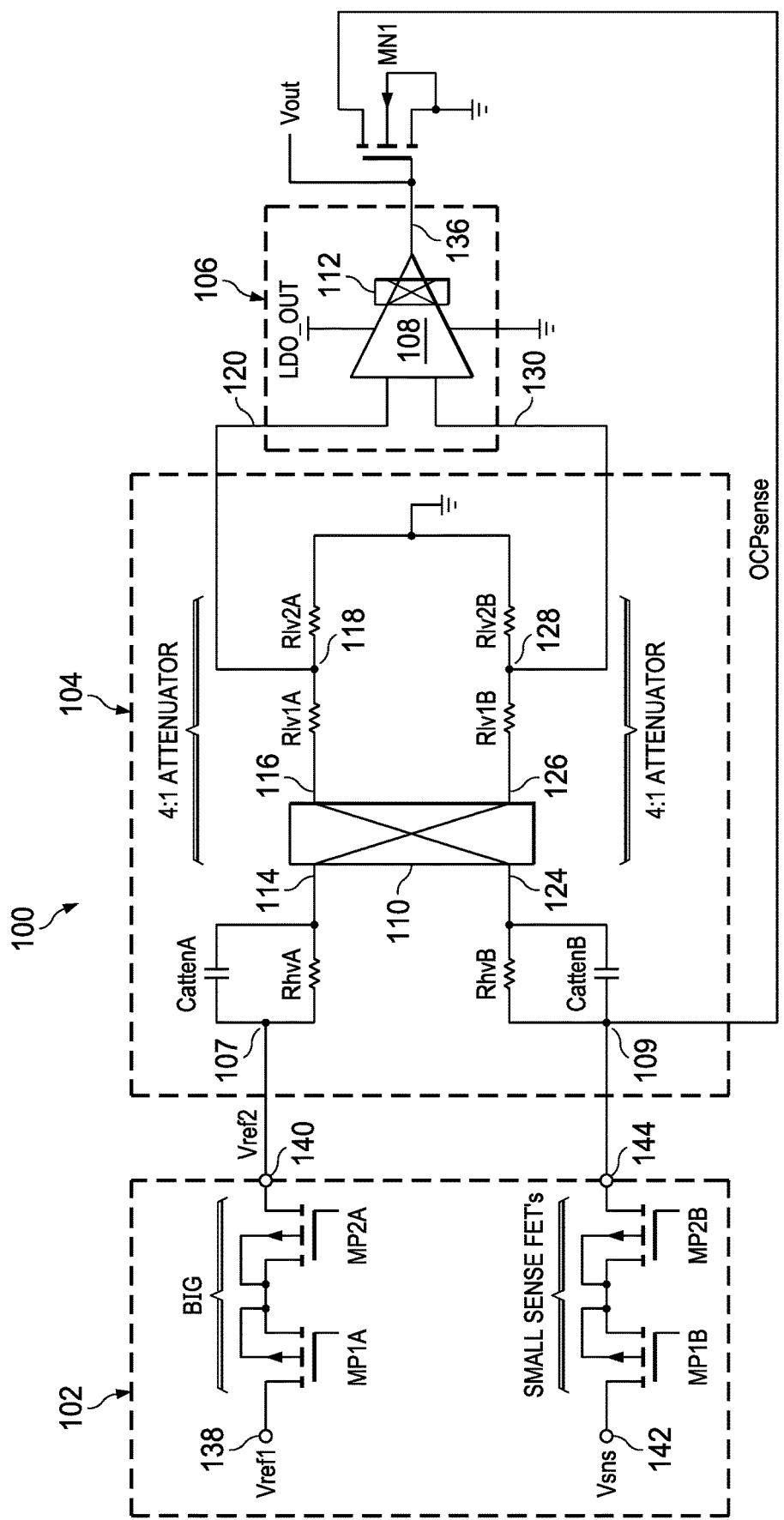
FIG. 1 depicts an example of a current sense loop for a high-voltage circuit according to an embodiment of the disclosure.

FIG. 1 depicts a current sense loop 100 for a high-voltage circuit. While current sense loop 100 has many resemblances to current sense loop 400, rather than input chopper circuit 110 being a part of amplifier circuit 106, input chopper circuit 110 is now embedded in attenuator circuit 104, although the action of input chopper circuit 110 is the same as input chopper circuit 410 and input chopper circuit 510. Moving input chopper circuit 110 into attenuator circuit 104 can provide a reduction in the size of the resistors in the attenuator circuit 104 and can also provide a reduction in the error due to mismatch of the attenuator resistors, as will be discussed below.

Current sense loop 100 again includes switches 102, attenuator circuit 104, amplifier circuit 106 and an NFET MN1. Switches 102 include a power switch and a sense switch. The power switch has a first power terminal 138 and a second power terminal 140; the sense switch has a first sense terminal 142 and a second sense terminal 144. In one embodiment, the ratio of the size of the power switch to the size of the sense switch is between about 1500:1 and about 2500:1. In current sense loop 100, the power switch includes first power PFET MP1A and second power PFET MP2A and the sense switch includes first sense PFET MP1B, and second sense PFET MP2B. Each of first power PFET MP1A, second power PFET MP2A, first sense PFET MP1B, and second sense PFET MP2B are again coupled to be controlled by a single driver circuit (not specifically shown in this figure).

Attenuator circuit 104 has a first attenuator input 107, a second attenuator input 109, a first attenuator output 118 and a second attenuator output 128. Amplifier circuit 106 has a first amplifier input 120, a second amplifier input 130, and an amplifier output 136. First power PFET MP1A and second power PFET MP2A receive a first reference voltage Vref1 at first power terminal 138 and pass the reference voltage from second power terminal 140 to the first attenuator input 107 as second reference voltage Vref2; first sense PFET MP1B and second sense PFET MP2B receive a sensed voltage Vsns at first sense terminal 142 and pass the sensed voltage Vsns from second sense terminal 144 to the second attenuator input 109.

Attenuator circuit 104 includes a first high-voltage resistor RhvA, a second high-voltage resistor RhvB, first attenuation capacitor CattenA, second attenuation capacitor CattenB, an embedded input chopper circuit 110, first low-voltage resistor Rlv1A, second low-voltage resistor Rlv2A, third low-voltage resistor Rlv1B, and fourth low-voltage resistor Rlv2B. The input chopper circuit 110 includes a first chopper input 114, a first chopper output 116, a second chopper input 124 and a second chopper output 126.

In a first leg of attenuator circuit 104, first attenuation capacitor CattenA is coupled in parallel with first high-voltage resistor RhvA between the first attenuator input 107 and the first chopper input 114. First low-voltage resistor Rlv1A and second low-voltage resistor Rlv2A are coupled in series between the first chopper output 116 and the ground plane, with the first attenuator output 118, which lies between first low-voltage resistor Rlv1A and second low-voltage resistor Rlv2A, being coupled to the first amplifier input 120. In a second leg of attenuator circuit 104, second attenuation capacitor CattenB is coupled in parallel with second high-voltage resistor RhvB between the second attenuator input 109 and the second chopper input 124. Third low-voltage resistor Rlv1B and fourth low-voltage resistor Rlv2B are coupled in series between the second chopper output 126 and the ground plane, with the second attenuator output 128, which lies between third low-voltage resistor Rlv1B and fourth low-voltage resistor Rlv2B, being coupled to the second amplifier input 130.

Amplifier circuit 106 includes an operational transconductance amplifier (OTA) 108 and an output chopper circuit 112. The first amplifier input 120 and second amplifier input 130 are also the inputs of OTA 108. The OTA 108 is coupled to the output voltage LDO_OUT of a low dropout regulator (not specifically shown) for power and is also coupled to the ground plane. NFET MN1 has a gate coupled to the amplifier output 136, a source coupled to the ground plane and a drain that is coupled to the second attenuator input 109. The output Vo of current sense loop 100 is taken at the amplifier output 136.

Unlike the attenuator 404 in FIG. 4, in which all of the resistors were high-voltage resistors, attenuator circuit 104 first drops the voltage into a low-voltage range using first high-voltage resistor RhvA and second high-voltage resistor RhvB, then forms resistive dividers using first low-voltage resistor Rlv1A, second low-voltage resistor Rlv2A, third low-voltage resistor Rlv1B, and fourth low-voltage resistor Rlv2B, which consume much less space. Although the low-voltage resistors are more sensitive to mismatch errors due to their smaller size, by including the resistive dividers between input chopper circuit 110 and output chopper circuit 112, the mismatch error is largely removed.

In one embodiment, the current sense loop 100 is part of an overcurrent protection circuit having an input voltage of about 14 V; using attenuator circuit 104, the voltage into amplifier circuit 106 was brought down to 4.2 V. For the purpose of comparing current sense loop 400 and current sense loop 100, high-voltage resistors R41A and R41B in current sense loop 400 and first high-voltage resistor RhvA and second high-voltage resistor RhvB in current sense loop 100 are referred to as "upper" resistors, while high-voltage resistors R42A, R42B in current sense loop 400 and first low-voltage resistor Rlv1A, second low-voltage resistor Rlv2A, third low-voltage resistor Rlv1B, and fourth low-voltage resistor Rlv2B in current sense loop 100 are referred to as "lower" resistors.

In one embodiment, the upper resistors in both current sense loop 400 and current sense loop 100 are the same size, while the width of the lower resistors in current sense loop 400 are 200 times the width of the lower resistors in current sense loop 100, with additional decreases being provided in the length of the lower resistors. In this embodiment, the lower resistors in attenuator 404 occupy 4,377,315 $\mu m^2$, while the lower resistors in attenuator circuit 104 occupy 667,780 $\mu m^2$, an area saving of about 3.7 $mm^2$, making the lower resistors in attenuator circuit 104 about six times smaller than the lower resistors in attenuator 404.

Because the mismatch between low-voltage resistors Rlv1A, Rlv2A and corresponding low-voltage resistors Rlv1B, Rlv2B is essentially removed by the choppers, the only remaining mismatch error in the attenuator circuit 104 is from the high-voltage resistors RhvA, RhvB. However, since these high-voltage resistors are quite large, the mismatch between first high-voltage resistor RhvA and second high-voltage resistor RhvB becomes only a minor error. The 3-sigma error contribution of the lower resistors in attenuator circuit 104 with a five percent duty cycle error in the chopper clock was 0.01006 percent.

Figure 2:
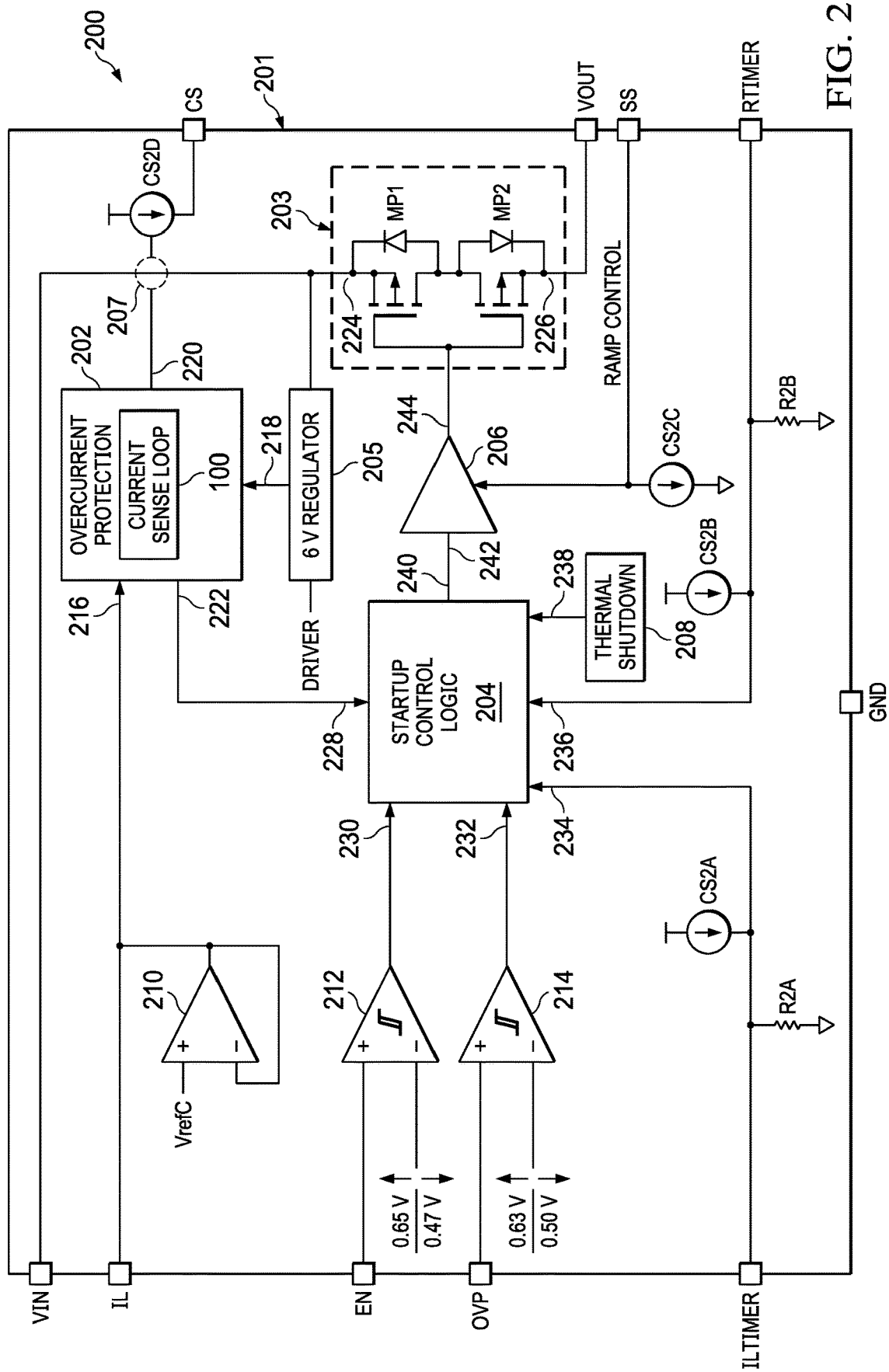
FIG. 2 depicts a block diagram of a high-voltage electronic device that includes a current sense loop according to an embodiment of the disclosure.

FIG. 2 depicts a block diagram of an electronic device 200 that includes current sense loop 100. In the embodiment shown, electronic device 200 is a load switch integrated circuit (IC) 201, in which current sense loop 100 is part of an overcurrent protection circuit 202. The load switch IC 201 was designed for use in space, but can be more broadly used following a regulator for switching loads in and out of a power supply rail. The load switch IC 201 can also be used to provide redundancy in which two different input power supplies, e.g., a primary supply and secondary supply, are each coupled to a respective load switch IC 201 and the two load switch ICs 201 have their output coupled together. Overcurrent protection circuit 202 has a current limit input 216, a regulator input 218, a current sensing node 220, and an overcurrent output 222. The current limit input 216 is coupled to current limit pin IL, the regulator input 218 is coupled to a 6-V regulator 205, and the current sensing node 220 is coupled to a current monitoring element 207. Load switch IC 201 also includes a power switch 203, startup control logic circuit 204, a control amplifier 206, thermal shutdown circuit 208, current-limit amplifier 210, enable comparator 212, and overvoltage comparator 214. In electronic device 200, power switch 203 has a first power terminal 224 that is coupled to power input pin VIN and a second power terminal 226 that is coupled to power output pin VOUT. In one embodiment power switch 203 includes first power PFET MP1 and second power PFET MP2, which are coupled in series between power input pin VIN and power output pin VOUT. First power PFET MP1 has a first gate and second PFET MP2 has a second gate. Startup control logic circuit 204 has a first control input 228, a second control input 230, a third control input 232, a fourth control input 234, a fifth control input 236, a sixth control input 238, and a control output 240. Control amplifier 206 has a control-amp input 242 and a control-amp output 244. The control-amp input 242 is coupled to control output 240 and the control-amp output 244 is coupled to the gate of both first power PFET MP1 and second power PFET MP2. Although not specifically shown in this figure, the control-amp output 244 is also coupled to the gate of both a first sense PFET and a second sense PFET (neither specifically shown in this figure).

The 6-V regulator 205 is coupled to power input pin VIN and provides a regulated voltage to overcurrent protection circuit 202. Current limit pin IL provides for a current limit, which is defined as a soft short, to be programmed into load switch IC 201 by connecting a first external resistor (not specifically shown) between the current limit pin IL and the ground plane. The current limit is provided to the current limit input 216 of overcurrent protection circuit 202 and to the inverting input of current-limit amplifier 210, while the non-inverting input of current-limit amplifier 210 receives a reference voltage VrefC. Overcurrent output 222 of overcurrent protection circuit 202 is coupled to the first control input 228 to provide an overcurrent signal.

An enable pin EN is used to provide a control signal to startup control logic circuit 204 to control the on and off state of first power PFET MP1 and second power PFET MP2. Enable comparator 212 has a non-inverting enable input, an inverting enable input, and an enable output. The enable pin EN is coupled to the non-inverting enable input. The inverting enable input receives a hysteretic enable reference voltage that in one embodiment provides an enable rising voltage of 0.65 V and an undervoltage falling voltage of 0.47 V. The enable output is coupled to the second control input 230. Similarly, overvoltage pin OVP is used to provide a value for an overvoltage condition. Overvoltage comparator 214 has a non-inverting overvoltage input, an inverting overvoltage input, and an overvoltage output. Overvoltage pin OVP is coupled to the non-inverting overvoltage input and the overvoltage output is coupled to the third control input 232. The inverting overvoltage input receives a hysteretic overvoltage reference voltage that in one embodiment provides 0.63 V on a rising overvoltage condition and 0.50 V on a falling overvoltage condition. The limits for the hysteretic enable reference voltage can be changed by coupling a first external resistor divider (not specifically shown) between the power input pin VIN and the ground plane and coupling a point on the first external resistor divider to the enable pin EN. The limits for the hysteretic overvoltage reference voltage can be changed by coupling a second external resistor divider (not specifically shown) between the power input pin VIN and the ground plane and coupling a point on the second external resistor divider to the overvoltage pin OVP.

A current limit timer pin ILTIMER is coupled to the fourth control input 234; a first current source CS2A is coupled between the input voltage and current limit timer pin ILTIMER; and a first pull-down resistor R2A is coupled between current limit timer pin ILTIMER and the ground plane. Current limit timer pin ILTIMER is designed to have a first external capacitor (not specifically shown) coupled between the current-limit timer pin ILTIMER and the ground plane. The current limit timer pin ILTIMER will charge the first external capacitor to 0.5 V when an overload condition occurs using first current source CS2A and will discharge the first external capacitor through a first pull-down resistor R2A.

A retry timer pin RTIMER is coupled to fifth control input 236; a second current source CS2B is coupled between the input voltage and retry timer pin RTIMER; and a second pull-down resistor R2B is coupled between retry timer pin RTIMER and the ground plane. Retry timer pin RTIMER is designed to have a second external capacitor (not specifically shown) coupled between retry timer pin RTIMER and the ground plane. The time that the device will be at the current limit before turning off is configured by the second external capacitor. Thermal shutdown circuit 208 is coupled to sixth control input 238 to provide a thermal shutdown signal if temperatures on the chip become too high.

A soft start pin SS is coupled to control amplifier 206; a third current source CS2C is coupled between the soft start pin SS and the ground plane. A third external capacitor (not specifically shown) is designed to be coupled between soft start pin SS and the power output pin VOUT in order to control the slew rate of first power PFET MP1 and second power PFET MP2. A fourth current source CS2D is coupled between the input voltage and current sense pin CS and is further coupled to the current monitoring element 207; fourth current source CS2D provides a current that is proportional to the output current of the load switch IC 201 for current sensing applications.

Figure 3:
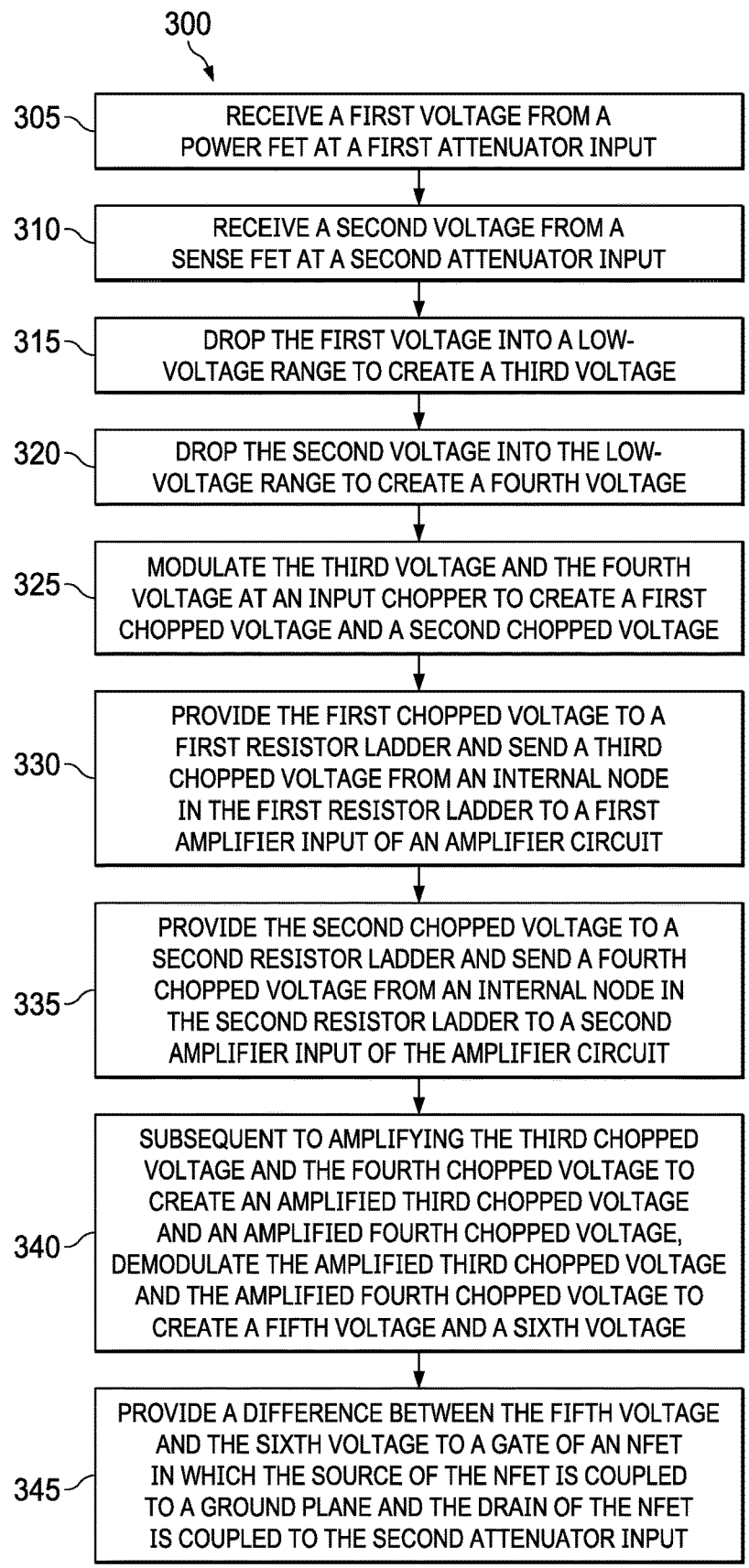
FIG. 3 depicts a method of operating an electronic device having a current sense loop according to an embodiment of the disclosure.

FIG. 3 depicts a method 300 of operating a high-voltage electronic device that includes a current sense loop. Method 300 includes receiving 305 a first voltage from a power FET at a first attenuator input and receiving 310 a second voltage from a sense FET at a second attenuator input. In current sense loop 100, the first voltage is received from second power PFET MP2A and the second voltage is received from second sense PFET MP2B. The method continues with dropping 315 the first voltage into a low-voltage range to create a third voltage, i.e., the voltage received at the first chopper input 114, and dropping 320 the second voltage into the low-voltage range to create a fourth voltage, i.e., the voltage received at the second chopper input 124. The third voltage and the fourth voltage are modulated 325 at an input chopper to create a first chopped voltage, i.e., the voltage at first chopper output 116, and a second chopped voltage, i.e., the voltage at second chopper output 126. Method 300 provides 330 the first chopped voltage to a first resistor ladder and sends a third chopped voltage from an internal node in the first resistor ladder to a first amplifier input of an amplifier circuit. Method 300 also provides 335 the second chopped voltage to a second resistor ladder and sends a fourth chopped voltage from an internal node in the second resistor ladder to a second amplifier input of the amplifier circuit. In current sense loop 100, the third chopped voltage is taken at first attenuator output 118 and provided at first amplifier input 120 and the fourth chopped voltage is taken from second attenuator output 128 and provided at second amplifier input 130. Subsequent to amplifying the third chopped voltage and the fourth chopped voltage to create an amplified third chopped voltage and an amplified fourth chopped voltage, the amplified third chopped voltage and the amplified fourth chopped voltage are demodulated 340 to create a fifth voltage and a sixth voltage. Although not specifically shown in current sense loop 100, the amplified third chopped voltage and the amplified fourth chopped voltage are presented at the inputs of output chopper circuit 112 and the fifth voltage and the sixth voltage are presented at the outputs of output chopper circuit 112. Finally, a difference between the fifth voltage and the sixth voltage are provided 345 to a gate of an NFET in which the source of the NFET is coupled to the ground plane and the drain of the NFET is coupled to the second attenuator input. The difference between the fifth voltage and the sixth voltage is presented at the amplifier output 136.

Applicants have disclosed a current sense loop that can be utilized to sense a current in a high-voltage application using low voltage circuitry with very low error added by the attenuator. Although shown as being used in an overcurrent protection circuit in a high-voltage load switch, the disclosed current sense loop can be used in any high-voltage sensing circuit to provide very low error from the resistors. A method of operating a high-voltage electronic device that includes a current sense loop has also been disclosed.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A current sense loop comprising:
    an attenuator circuit that includes a first leg, a second leg, and an embedded input chopper circuit, the first leg having a first attenuator input and a first attenuator output, the second leg having a second attenuator input and a second attenuator output, the embedded input chopper circuit having a first chopper input, a first chopper output, a second chopper input, and a second chopper output, the first chopper input coupled to the first attenuator input, the first chopper output coupled to the first attenuator output, the second chopper input coupled to the second attenuator input, and the second chopper output coupled to the second attenuator output;
    an amplifier circuit having a first amplifier input, a second amplifier input, and an amplifier output, the first amplifier input being coupled to the first attenuator output, the second amplifier input being coupled to the second attenuator output, the amplifier circuit further including an output chopper circuit; and
    an N-type field effect transistor (NFET) having a gate coupled to the amplifier output, a source coupled to a ground plane, and a drain coupled to the second attenuator input.

2. The current sense loop as recited in claim 1 in which the attenuator circuit includes:
    a first attenuation capacitor coupled in parallel with a first high-voltage resistor between the first attenuator input and the first chopper input, the first attenuator input coupled to an output of a power switch;
    a first low-voltage resistor and a second low-voltage resistor coupled in series between the first chopper output and the ground plane, the first attenuator output lying between the first low-voltage resistor and the second low-voltage resistor;
    a second attenuation capacitor coupled in parallel with a second high-voltage resistor between the second attenuator input and the second chopper input, the second attenuator input being coupled to an output of a sense switch; and
    a third low-voltage resistor and a fourth low-voltage resistor coupled in series between the second chopper output and the ground plane, the second attenuator output lying between the third low-voltage resistor and the fourth low-voltage resistor.

3. The current sense loop as recited in claim 2 in which a combination of the first low-voltage resistor, the second low-voltage resistor, the third low-voltage resistor, and the fourth low-voltage resistor occupies 667,780 $\mu m^2$.

4. The current sense loop as recited in claim 2 in which:
    the power switch includes a first power P-type field effect transistor (PFET) and a second power PFET coupled in series; and
    the sense switch includes a first sense PFET and a second sense PFET coupled in series.

5. The current sense loop as recited in claim 4 in which the embedded input chopper circuit includes:

a first switch coupled between the first chopper input and the first chopper output;
a second switch coupled between the second chopper input and the second chopper output;
a third switch coupled between the first chopper input and the second chopper output; and
a fourth switch coupled between the second chopper input and the first chopper output, the first switch and the second switch closing during a first phase and the third switch and the fourth switch closing during a second phase.

6. The current sense loop as recited in claim 1 in which a high voltage is greater than about 7 V and a low voltage is less than about 7 V.

7. An electronic device comprising:
a power switch having a first power terminal and a second power terminal, the first power terminal coupled to a power input pin and the second power terminal coupled to a power output pin;
a sense switch having a first sense terminal and a second sense terminal, the first sense terminal coupled to a sensed voltage;
an attenuator circuit having a first attenuator input, a first attenuator output, a second attenuator input, a second attenuator output, and an input chopper circuit embedded therein, the first attenuator input coupled to the second power terminal, the second attenuator input coupled to the second sense terminal, the input chopper circuit having a first chopper input, a first chopper output, a second chopper input, and a second chopper output, the first chopper input coupled to the first attenuator input, the first chopper output coupled to the first attenuator output, the second chopper input coupled to the second attenuator input, and the second chopper output coupled to the second attenuator output;
an amplifier circuit having a first amplifier input, a second amplifier input, an amplifier output, and an output chopper circuit, the first amplifier input coupled to the first attenuator output, the second amplifier input coupled to the second attenuator output; and
an N-type field effect transistor (NFET) having a gate coupled to the amplifier output, a source coupled to a ground plane, and a drain coupled to the second attenuator input.

8. The electronic device as recited in claim 7 in which the power switch has a ratio to the sense switch between about 1500:1 and about 2500:1.

9. The electronic device as recited in claim 8 in which:
the power switch includes a first power P-type field effect transistor (PFET) and a second power PFET coupled in series between the first power terminal and the second power terminal, the first power PFET having a first gate and the second power PFET having a second gate; and
the sense switch includes a first sense PFET and a second sense PFET coupled in series between the first sense terminal and the second sense terminal.

10. The electronic device as recited in claim 9 including:
a startup control logic circuit having a first control input, a second control input, a third control input, a fourth control input, a fifth control input, a sixth control input, and a control output; and
a control amplifier having a control-amp input and a control-amp output, the control-amp input being coupled to the control output and the control-amp output being coupled to the first gate and the second gate.

11. The electronic device as recited in claim 10 including an overcurrent protection circuit that includes the attenuator circuit, the amplifier circuit, the NFET, a current limit input, a regulator input, a current sensing node, and an overcurrent output, the current limit input being coupled to a current limit pin, the regulator input being coupled to a 6-V regulator, the current sensing node being coupled to a current monitoring element, and the overcurrent output being coupled to the first control input.

12. The electronic device as recited in claim 11 including:
an enable comparator having a non-inverting enable input, an inverting enable input and an enable output, the non-inverting enable input being coupled to an enable pin, the inverting enable input being coupled to a hysteretic enable reference voltage, and the enable output being coupled to the second control input; and
an overvoltage comparator having a non-inverting overvoltage input, an inverting overvoltage input, and an overvoltage output, the non-inverting overvoltage input being coupled to an overvoltage pin, the inverting overvoltage input being coupled to a hysteretic overvoltage reference voltage, and the overvoltage output being coupled to the third control input.

13. The electronic device as recited in claim 12 including:
a current limit timer pin coupled to the fourth control input;
a first pull-down resistor coupled between the current limit timer pin and the ground plane;
a first current source coupled between the a voltage input and the current limit timer pin;
a retry timer pin coupled to the fifth control input;
a second pull-down resistor coupled between the retry timer pin and the ground plane;
a second current source coupled between the voltage input and the retry timer pin; and
a thermal shutdown circuit coupled to the sixth control input.

14. The electronic device as recited in claim 7 in which the electronic device is a load switch integrated circuit.

15. A method of operating a high-voltage electronic device that includes a current sense loop, the method comprising:
receiving a first voltage from a power field effect transistor (FET) at a first attenuator input;
receiving a second voltage from a sense FET at a second attenuator input;
dropping the first voltage into a low-voltage range to create a third voltage;
dropping the second voltage into the low-voltage range to create a fourth voltage;
modulating the third voltage and the fourth voltage at an input chopper to create a first chopped voltage and a second chopped voltage;
providing the first chopped voltage to a first resistor ladder and sending a third chopped voltage from an internal node in the first resistor ladder to a first amplifier input of an amplifier circuit;
providing the second chopped voltage to a second resistor ladder and sending a fourth chopped voltage from an internal node in the second resistor ladder to a second amplifier input of the amplifier circuit;
subsequent to amplifying the third chopped voltage and the fourth chopped voltage to create an amplified third chopped voltage and an amplified fourth chopped voltage, demodulating the amplified third chopped voltage and the amplified fourth chopped voltage to create a fifth voltage and a sixth voltage; and providing a difference between the fifth voltage and the sixth voltage to a gate of an N-type field effect transistor (NFET), a source of the NFET being coupled to a ground plane and a drain of the NFET being coupled to the second attenuator input.

16. A current sense loop comprising:
an attenuator circuit that includes a first leg, a second leg, and an embedded input chopper circuit, the first leg having a first attenuator input and a first attenuator output, the second leg having a second attenuator input and a second attenuator output, the embedded input chopper circuit having a first chopper input, a first chopper output, a second chopper input, and a second chopper output, the first chopper input coupled to the first attenuator input, the first chopper output coupled to the first attenuator output, the second chopper input coupled to the second attenuator input, and the second chopper output coupled to the second attenuator output; and
an amplifier circuit having a first amplifier input, a second amplifier input, and an amplifier output, the first amplifier input being coupled to the first attenuator output, the second amplifier input being coupled to the second attenuator output, the amplifier circuit further including an output chopper circuit.

17. The current sense loop of claim 16 including an N-type field effect transistor (NFET) having a gate coupled to the amplifier output, a source coupled to a ground plane, and a drain coupled to the second attenuator input.

18. The current sense loop as recited in claim 16 in which the attenuator circuit includes:
a first capacitor coupled in parallel with a first resistor between the first attenuator input and the first chopper input;
a second resistor and a third resistor coupled in series between the first chopper output and a ground plane, the first attenuator output lying between the second resistor and the third resistor;
a second capacitor coupled in parallel with a fourth resistor between the second attenuator input and the second chopper input; and
a fifth resistor and a sixth resistor coupled in series between the second chopper output and the ground plane, the second attenuator output lying between the fifth resistor and the sixth resistor.

19. The current sense loop as recited in claim 16 including:
a power switch that includes a first power P-type field effect transistor (PFET) and a second power PFET coupled in series, the power switch having a reference voltage input and having an output coupled to the first attenuator input; and
a sense switch that includes a first sense PFET and a second sense PFET coupled in series, the sense switch having a sense voltage input and having an output coupled to the second attenuator input.

20. The current sense loop as recited in claim 16 in which the embedded input chopper circuit includes:
a first switch coupled between the first chopper input and the first chopper output;
a second switch coupled between the second chopper input and the second chopper output;
a third switch coupled between the first chopper input and the second chopper output; and
a fourth switch coupled between the second chopper input and the first chopper output, the first switch and the second switch closing during a first phase and the third switch and the fourth switch closing during a second phase.

21. A load switch integrated circuit including the current sense loop of claim 16.

* * * * *